(12) United States Patent
Becker et al.

(10) Patent No.: US 6,850,921 B1
(45) Date of Patent: Feb. 1, 2005

(54) METHOD FOR CASCADING VEHICLE SYSTEM TARGETS TO COMPONENT LEVEL DESIGN OBJECTIVES

(75) Inventors: Beverly Joyce Becker, Harper Woods, MI (US); Chi-Chin Wu, W. Bloomfield, MI (US); Gregory Allen Kaepp, Dearborn, MI (US); Hassen Hammoud, Dearborn, MI (US); Han C. Wang, Ann Arbor, MI (US); Keming Chen, Troy, MI (US); Nanxin Wang, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 832 days.

(21) Appl. No.: 09/705,008

(22) Filed: Nov. 2, 2000

(51) Int. Cl.$^7$ ............................................. G06F 15/18
(52) U.S. Cl. .............................. 706/12; 706/16; 706/25
(58) Field of Search .............................. 706/12, 16, 25

*Primary Examiner*—George B. Davis
(74) *Attorney, Agent, or Firm*—Artz & Artz, P.C.; Damian Porcari

(57) ABSTRACT

A method (100) for cascading system level target to component level design objectives using machine learning and design synthesis techniques. The method (100) of the present invention uses machine learning techniques to build (106, 108) surrogate models from given system targets (102). The method then employs design synthesis methods to determine (110) a range of component level design objectives for the given system level targets using the surrogate models. The range of component level design objectives is fed back (112) to one of the surrogate models to determine (114) the component design objectives.

16 Claims, 2 Drawing Sheets

METHOD FOR CASCADING VEHICLE SYSTEM TARGETS TO COMPONENT LEVEL DESIGN OBJECTIVES

TECHNICAL FIELD

The present invention relates generally to a method for cascading system level performance targets to a component level and more particularly, to a method for cascading system level performance targets using machine learning and design synthesis techniques.

BACKGROUND OF THE INVENTION

Vehicle system level performance targets are used to design and build new and desirable products, such as automobiles. The system level targets are determined based on the needs of both the customer and the corporation, as well as regulatory requirements. Typically, the targets are established in the early stages of a vehicle's inception. Once the system level targets are set, component level design objectives are determined. The process of determining component level design objectives from system level targets is called target cascading and is a major task in the design and building of a vehicle.

Typically, the component level design objectives are determined using existing physical test results and Computer Aided Engineering (CAE) simulations. The prior art process requires engineers to make assumptions and judgment calls. Numerous iterations are required that involve running computer models, analyzing results, changing assumptions, and making trade-off's among multifunction attributes. The process is extremely time consuming and difficult due to the fact that there is typically insufficient useful information available to engineers during the early design stages. The engineers must rely on information from a previous design. Additionally, changing existing Finite Element Analysis (FEA) models and running CAE simulations is extremely time consuming and not practical in the fast paced process of designing and building new products.

There is a need to reduce or eliminate the trial and error built into the current process for target cascading. It is desirable for an engineer to obtain the component level design objectives for given system level targets as directly as possible, i.e. without numerous trial and error iterations.

SUMMARY OF THE INVENTION

It is an object of the present invention to provide a systematic approach to target cascading. It is another object of the present invention to improve the speed and accuracy of the target cascading process.

It is a further object of the present invention to use machine learning techniques and design synthesis to obtain component level design objectives from a set of system level performance targets. It is still a further object of the present invention to build surrogate models using machine learning, obtain component level design parameter ranges for a set of given system level targets using the surrogate models and feeding the design ranges back to the surrogate models to obtain a set of component level design objectives.

In carrying out the above objects and other objects and features of the present invention, a method is provided for a systematic approach to target cascading. The method of the present invention uses machine learning techniques to build surrogate models from existing CAE simulation results, test results, or bench marking data. The method then employs design synthesis methods to find component level design objectives for given system level targets using the surrogate models. According to the method of the present invention, an engineer can obtain the component level design objectives and design ranges for a specific set of system level targets directly.

Other objects and advantages of the present invention will become apparent upon reading the following detailed description and appended claims, and upon reference to the accompanying drawings.

BRIEF DESCRIPTION OF THE DRAWINGS

For a more complete understanding of this invention, reference should now be had to the embodiments illustrated in greater detail in the accompanying drawings and described below by way of examples of the invention. In the drawings.

DETAILED DESCRIPTION OF PREFERRED EMBODIMENTS

The present invention is a method for cascading system level targets to component level targets using machine learning and design synthesis techniques. The method is described herein as it would be applied to the automotive industry and particularly to a frontal impact analysis. It should be noted that the present invention is applicable to not only a wide variety of products, but to many aspects of the design process. For example, in the automotive industry, the process may be applied to frontal impact analysis, vehicle bumper systems, fuel economy targets, weight targets, Noise Vibration Harshness (NVH) targets, and others too numerous to mention herein.

Figure 1:
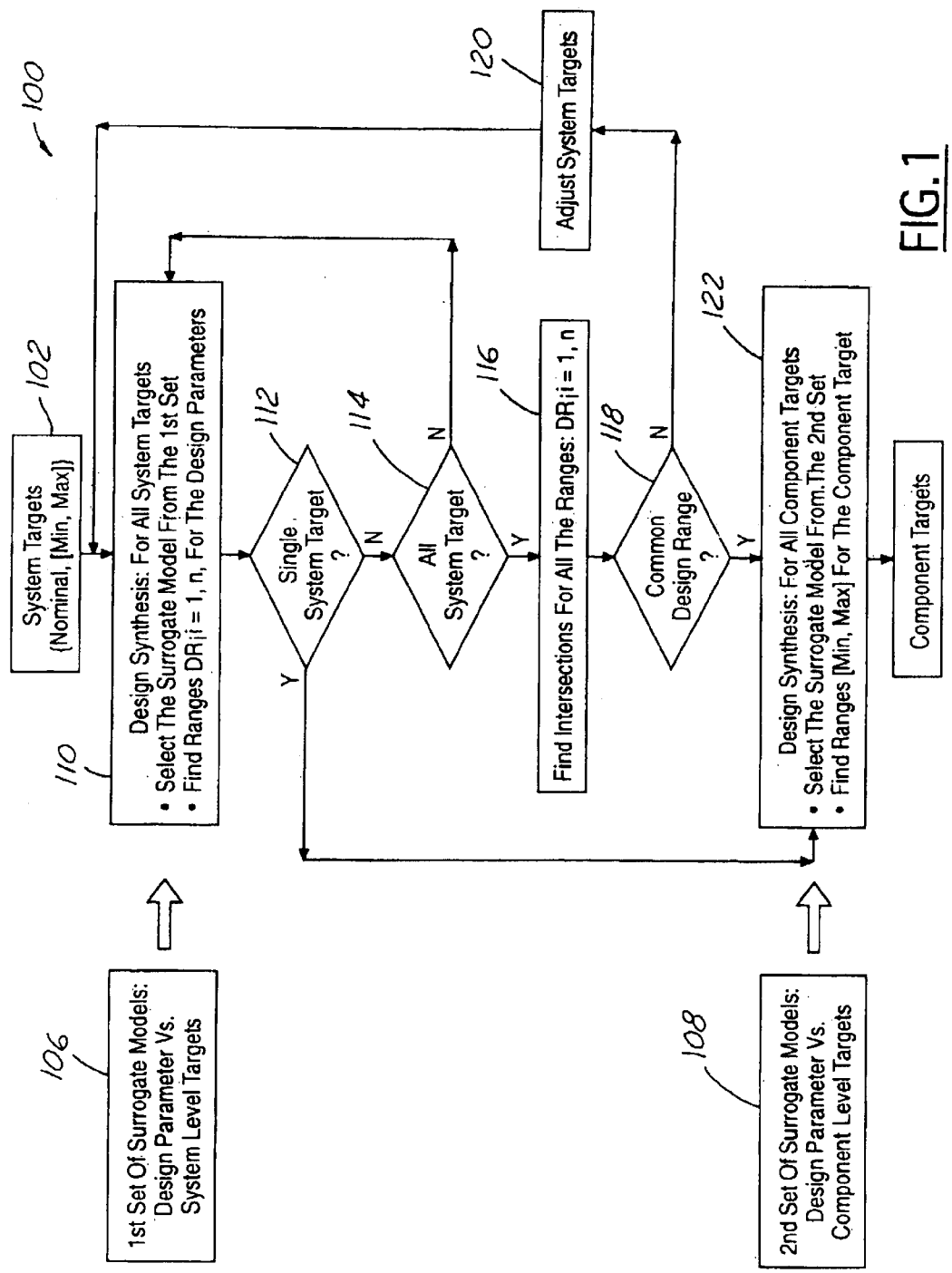
FIG. 1 is a flow chart of the target cascading method of the present invention.

FIG. 1 is a flow chart of the method 100 of the present invention. A set of vehicle system level targets are predetermined 102 in the early stages of the vehicle's design and are based on customer wants, corporate wants and regulatory requirements. The set of system level targets has a nominal value, a minimum value and a maximum value that define limits to specify a range for the performance characteristics. A machine learning process is used to build 106 a first set of surrogate models between known design parameters and the system level targets. A second set of surrogate models is developed 108 between the design parameters and a set of component level targets. The development of the first and second sets of surrogate models is best explained with reference to a specific example, which is provided later herein.

According to the present invention, machine learning techniques are used to build 106, 108 the first and second surrogate models. Machine learning is the study of computer algorithms that automatically improve through experience. Machine learning is inherently interdisciplinary, being built on concepts taken from the fields of artificial intelligence, probability and statistics, information theory, neurobiology, to name but a few. There are many machine learning techniques available, such as "decision tree" and "neural network" methods. Any machine learning method may be used in the present invention.

The next step in the method 100 of the present invention is to determine ranges 110 for the design parameters. Design synthesis techniques are used to determine the design parameter ranges using a surrogate model selected from the first set of surrogate models. A surrogate model is chosen for each system level target. Therefore, for a single system target, a single surrogate model is chosen from the first set. For more than one system level target, a surrogate model is chosen for each system level target. Design synthesis searches the set to determine ranges, $DR_I, I=1,n$, for the design parameters based on the set of system targets.

This approach differs significantly from the prior art approach, which included design analysis. In a design analysis approach, the design performance characteristics for a given set of design variables are evaluated. The design synthesis approach in the present invention is somewhat of a reverse process of design analysis, wherein the design parameters are determined from given system level targets.

As discussed above, the present invention is applicable to the determination of component targets for all of the system level targets 102 in the set of system level targets. In a case where a set contains more than one system level target, the same approach for determining the design range will be applied to each system level target. Therefore, a surrogate model is chosen for each system level target. The final result will be the intersection of all the individual results. In a case where that intersection is null, there is no solution and the targets need to be adjusted.

Referring to FIG. 1, the method of the present invention is equally applicable to a single system level target 112 in the set of targets as it is to a plurality of targets 114 in the set of system level targets. For a plurality of targets 114, the method 100 determines the intersection 116 for all of the ranges, $DR_I, I=1,n$, for each of the system level targets in the set. If there is no common design range 118 (i.e. the intersection is null), the system level targets are adjusted 120, and the ranges are determined 110 according to design synthesis. These steps, 116, 118 and 120 are not necessary for a single system target 112.

Once a common design range 118 for the design parameters has been established, or in the case of a single system level target the design range determined in step 110, is applied to a design synthesis technique again in order to find ranges, [min, max] for the component targets 122. A surrogate model is chosen, for each component target, from the second set of surrogate models 108 and used to find the ranges for the component targets.

Figure 2:
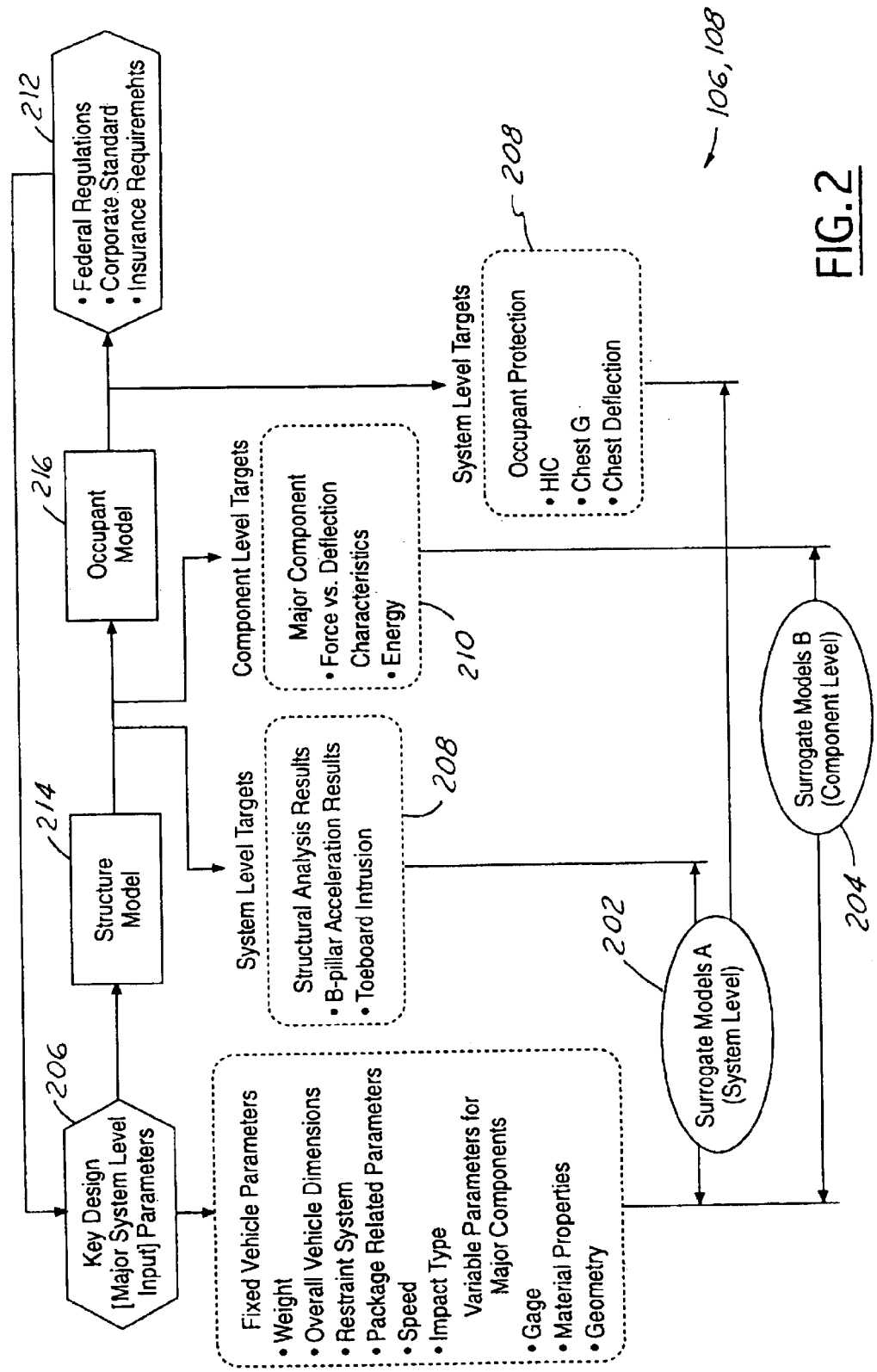
FIG. 2 is a flow chart for the step of building a surrogate model according to the method of the present invention as it would be applied to vehicle structure impact analysis.

As discussed above, explanation of the development of the first and second surrogate models is best described with reference to a particular example. FIG. 2 is a flow chart of the development 106, 108 of the surrogate models for vehicle structure impact analysis according to the method of the present invention, which includes machine learning. The first surrogate model 202 captures the behavior between key design parameters 206 and the system level performance variables 208. The second surrogate model 204 captures the behavior between the key design parameters 206 and the component level performance variables 210.

In the present example of a frontal impact analysis, the key design parameters 206 include fixed and variable parameters. The fixed parameters include, but are not limited to, vehicle weight, overall vehicle dimensions, the restraint system, etc. The variable parameters include, but are not limited to, major component gauges, material properties, and geometry of the vehicle.

The system performance variables 208 include, but are not limited to, toeboard intrusion (deformation in the footwell area), HIC number (Head Injury Criteria), chest G (chest acceleration), and chest deflection. The component performance variables 210 include force-deflection characteristics. In the present example, the system performance variables are taken from a structure model 214 and an occupant model 216. The component performance variables 210 are taken from the structure model 214. In the present example, the structure model 214 is derived from a full FEA model. For example, a commercial FEA code may be used. The occupant model 216 is a dynamic model and is also derived from a commercially available code. Typically machine learning techniques are used to derive the surrogate models.

The surrogate models are used in the method 100 in order to obtain ranges for the component targets to facilitate design of the components. As long as the component level design parameters are within the resultant design ranges, the specified system level targets are met. This is because of the interdependency of the first and second sets of surrogate models, the design parameters, the system level targets and the component level targets.

The design parameter ranges determined from the first set of surrogate models are used as input to a surrogate model chosen from the second set of surrogate models to determine the component design objectives. For example, the design ranges of major component gauges and materials will be fed to the second surrogate model set and the result is a set of force-deflection ranges. The force-deflection ranges are used as component level design objectives. The component level design objectives obtained through the process are used for the component design. As long as the component design meets the component level design objectives, the system level performance targets have been achieved.

The present invention is applicable to the design of any system. The design of any complex system that can be represented in a hierarchy can be accomplished according to the present invention. For example, for a system that can be broken down into sub-systems, the sub-systems further broken down by sub-systems, and on ad infinitum, the present invention can be used to design the system at each level of the design.

The invention covers all alternatives, modifications, and equivalents, as may be included within the spirit and scope of the appended claims.

What is claimed is:

1. A method for determining component level design objectives from at least one system level target, said method comprising the steps of:

building a first set of surrogate models between design parameters and said at least one system level target;

building a second set of surrogate models between design parameters and component level targets;

determining a set of design parameter ranges based on said first set of surrogate models using design synthesis techniques; and feeding said set of ranges back to at least one surrogate model chosen from said second set of surrogate models to determine the set of component level design objectives for the given system level targets.

2. The method as claimed in claim 1 wherein said at least one system level target is cascaded with design variables, system level performance variables and component level performance variables, and wherein said step of building first and second surrogate models further comprises the steps of:

capturing the behavior between design variables and system level performance variables; and capturing the behavior between design variables and component level performance variables.

3. The method as claimed in claim 1 wherein said step of determining a set of ranges for the component level design objectives using the surrogate models further comprises the steps of:
applying a predetermined system level performance variable to a surrogate model chosen from said first set of surrogate models;
finding a design range of the design variables with said predetermined system level performance variable; and
feeding the design range of the design variables to a surrogate model chosen from said second set of surrogate models for component level design objectives.

4. The method as claimed in claim 3 further comprising the step of using said component level design objectives to determine component level designs.

5. The method as claimed in claim 1 wherein said steps of building first and second surrogate models further comprises building first and second surrogate models using machine learning techniques.

6. A method for determining component level design objectives from a plurality of system level targets, said method comprising the steps of:
building a first set of surrogate models between design parameters and said plurality of system level targets;
building a second set of surrogate models between design parameters and component level targets;
determining a set of design parameter ranges for a system level target in said plurality of system level targets based on at surrogate model chosen from said first set of surrogate models for each system level target using design synthesis techniques;
determining a set of design parameter ranges for at least another system level target in said plurality of system level targets based on a surrogate model chosen from said first set of surrogate models using design synthesis techniques;
determining a common design range from an intersection of each of said sets of design parameter ranges; and
feeding said common design range to at least one surrogate model chosen from said second set of surrogate models for each component level target to determine the set of component level design objectives for the plurality of given system level targets.

7. The method as claimed in claim 6 wherein said plurality of system level targets is cascaded with design variables, system level performance variables and component level performance variables, and wherein said step of building first and second surrogate models further comprises the steps of:
capturing the behavior between design variables and system level performance variables; and
capturing the behavior between design variables and component level performance variables.

8. The method as claimed in claim 6 wherein said step of determining a set of ranges for the component level design objectives using the surrogate models further comprises the steps of:
applying a predetermined system level performance variable to a surrogate model chosen from said first set of surrogate models;
finding a design range of the design variables with said predetermined system level performance variable;

applying at least another predetermined system level performance variable to said surrogate model chosen from said first set of surrogate models;
finding a design range of the design variables with said at least another predetermined system level performance variable;
determining a common design range from an intersection of each of said sets of design parameter ranges; and
feeding said common design range of the design variables to a surrogate model chosen from said second set of surrogate models for component level design objectives.

9. The method as claimed in claim 8 further comprising the step of using said component level design objectives to determine component level designs.

10. The method as claimed in claim 6 wherein said steps of building first and second surrogate models further comprises building first and second surrogate models using machine learning techniques.

11. A method for determining component level design objectives from a set of system level targets, said method comprising the steps of:
building a first set of surrogate models between design parameters and at least one system level target in said set of system level targets using machine learning techniques;
building a second set of surrogate models between design parameters and component level targets using machine learning techniques;
determining a set of design parameter ranges based on a surrogate model chosen from said first set of surrogate models using design synthesis techniques; and
feeding said set of ranges back to a surrogate model chosen from said second set of surrogate models to determine the set of component level design objectives for said at least one system level target in said set of system level targets.

12. The method as claimed in claim 11 wherein said system target is cascaded with design variables, system level performance variables and component level performance variables, and wherein said step of building first and second surrogate models further comprises the steps of:
capturing the behavior between design variables and system level performance variables; and
capturing the behavior between design variables and component level performance variables.

13. The method as claimed in claim 12 wherein said step of determining a set of ranges for the component level design objectives using the surrogate models further comprises the steps of:
applying a predetermined system level performance variable to a surrogate model chosen from said first set of surrogate models;
finding a design range of the design variables with said predetermined system level performance variable; and
feeding the design range of the design variables to a surrogate model chosen from said second set of surrogate models for component level design objectives.

14. The method as claimed in claim 13 further comprising the step of using said component level design objectives to determine component level designs.

15. The method as claimed in claim 11 wherein said steps of building first and second surrogate models further comprises building first and second surrogate models using machine learning techniques.

16. The method as claimed in claim 11 wherein said set of system level targets further comprises a plurality of system level targets and said method further comprises the steps of:

determining a set of de sign parameter ranges for at least another system level target in said plurality of system level targets based on a surrogate model chosen from said first set of surrogate models using design synthesis techniques;

determining a common design range from an intersection of said sets of design parameter ranges; and feeding said common design range to a surrogate model chosen from said second set of surrogate models to determine the set of component level design objectives for the plurality of given system level targets.

* * * * *